(12) United States Patent
Son et al.

(10) Patent No.: US 8,760,597 B2
(45) Date of Patent: Jun. 24, 2014

(54) SWITCHING DEVICE OF ACTIVE DISPLAY DEVICE AND METHOD OF DRIVING THE SWITCHING DEVICE

(75) Inventors: Kyoung-seok Son, Seoul (KR); Kwang-hee Lee, Suwon-si (KR); Jang-yeon Kwon, Seongnam-si (KR); Ji-sim Jung, Incheon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 260 days.

(21) Appl. No.: 12/805,382

(22) Filed: Jul. 28, 2010

(65) Prior Publication Data

US 2011/0170031 A1    Jul. 14, 2011

(30) Foreign Application Priority Data

Jan. 8, 2010   (KR) .................... 10-2010-0001894

(51) Int. Cl.
*G02F 1/136* (2006.01)

(52) U.S. Cl.
USPC .......................................................... 349/48

(58) Field of Classification Search
USPC .......................................................... 349/48
See application file for complete search history.

(56) References Cited

U.S. PATENT DOCUMENTS

| | | | | |
|---|---|---|---|---|
| 5,412,493 A | * | 5/1995 | Kunii et al. | 349/43 |
| 2005/0001805 A1 | * | 1/2005 | Jeon et al. | 345/92 |
| 2008/0123002 A1 | * | 5/2008 | Yeh | 349/37 |

FOREIGN PATENT DOCUMENTS

| | | |
|---|---|---|
| JP | 05-289107 | 11/1993 |
| JP | 2003-228342 | 8/2003 |
| JP | 2007-178952 | 7/2007 |
| KR | 10-2007-0122317 | 12/2007 |

* cited by examiner

*Primary Examiner* — Phu Vu
(74) *Attorney, Agent, or Firm* — Harness, Dickey & Pierce, P.L.C.

(57) ABSTRACT

Example embodiments are directed to a switching device of an active display device and a method of driving the switching device, such that electrical reliability of the active display device is improved. The switching device of the active display device includes a plurality of thin film transistors (TFTs) that are connected in series. Except for a refresh time duration during which the plurality of TFTs of the switching device are simultaneously turned ON, a positive voltage is applied to at least one of the plurality of TFTs of the switching device so that a reliability of the switching device may be improved.

14 Claims, 7 Drawing Sheets

SWITCHING DEVICE OF ACTIVE DISPLAY DEVICE AND METHOD OF DRIVING THE SWITCHING DEVICE

CROSS-REFERENCE TO RELATED APPLICATIONS

This application claims priority under 35 U.S.C. §119 to Korean Patent Application No. 10-2010-0001894, filed on Jan. 8, 2010, in the Korean Intellectual Property Office, the disclosure of which is incorporated herein in its entirety by reference.

BACKGROUND

1. Field

Example embodiments relate to a switching device of an active display device and methods of driving the switching device, and more particularly, to a switching device of an active display device and a method of driving the switching device, the switching device having an improved electrical reliability.

2. Description

An active display device includes a switching device that controls an operation of each pixel of the active display device. A thin film transistor (TFT) is used as a switching device for a display. For example, one pixel of the display includes one TFT as a switching device. The TFT may be, for example, a silicon-TFT, an oxide TFT, an organic TFT, or the like according to type of a semiconductor material used as a channel material. An oxide TFT having rapid switching speed is used as the switching device.

The switching device allows a desired voltage to charge a pixel unit by making a current flow in a channel of the TFT for a desired period of time. After the desired period of time, the switching device maintains the pixel unit in a charged state by turning off the TFT. In an active matrix liquid crystal display (AMLCD), a period of time in which the TFT is ON is determined according to a driving frequency and a resolution of the AMLCD. In the case of a driving operation at 120 Hz with a full high-definition (HD) class, a period of time in which one TFT is an on state is about 1/120/1080=7.7 μs. Then, for a remainder of one period (1/120=8.3 ms), the TFT remains in an OFF state. Thus, with respect to one period, the TFT of the active display device is mostly in an OFF state.

An amorphous silicon TFT or an oxide semiconductor TFT exhibits an n-type semiconductor characteristic, and thus, in order to turn off such a TFT, a negative gate voltage is applied to the TFT. Thus, the negative gate voltage is continuously applied to the TFT while the TFT is in the OFF state in the active display device. However, when the negative gate voltage is continuously applied to the TFT for a desired time period, a threshold voltage may shift toward a negative voltage. As a result, a leakage current may increase as the negative gate voltage is applied to the TFT. The shift of the threshold voltage may be severe when light is incident on the switching device. When the leakage current increases, image quality of the active display device may deteriorate.

SUMMARY

According to example embodiments, a switching device of an active display device includes at least two thin film transistors (TFTs) connected in series; and at least two gate lines respectively connected to the at least two TFTs.

According to example embodiments, each of the at least two TFTs includes an oxide semiconductor transistor having an oxide semiconductor as a channel.

According to example embodiments, the oxide semiconductor includes an oxide material selected from a group consisting of Zn-oxide, Ga—In—Zn oxide, In—Zn-oxide, In—Sn-oxide, and Sn-oxide, or includes an oxide material obtained by doping an element selected from a group consisting of aluminum (Al), nickel (Ni), copper (Cu), tantalum (Ta), titanium (Ti), and hafnium (Hf) to the oxide material.

According to example embodiments, a number of the at least two gate lines in each pixel row of the active display device is equal to a number of the at least two TFTs, and the at least two gate lines are respectively connected to gates of the at least two TFTs.

According to example embodiments, a positive gate voltage is applied to each of the at least two gate lines during a pixel charging time, the positive gate voltage turning on all of the at least two TFTs.

According to example embodiments, during times other than the pixel charging time, at least one of the at least two TFTs is off while remaining ones of the at least two TFTs are on.

According to example embodiments, the at least two gate lines correspond to pixel rows of the active display device, and the at least two TFTs are respectively connected to at least two gate lines from different pixel rows.

According to example embodiments, a positive gate voltage is applied to each of the at least two gate lines to turn on all of the at least two TFTs during a pixel charging time, and during times other than the pixel charging time, at least one of the at least two TFTs is off while remaining ones of the at least two TFTs are on.

According to example embodiments, each of the at least two TFTs includes an oxide semiconductor transistor having an oxide semiconductor as a channel.

According to example embodiments, the oxide semiconductor includes an oxide material selected from a group consisting of Zinc oxide, Ga—In—Zn oxide, In—Zn-oxide, In—Sn-oxide, and Tin-oxide, or includes an oxide material obtained by doping an element selected from a group consisting of aluminum (Al), nickel (Ni), copper (Cu), tantalum (Ta), titanium (Ti), and hafnium (Hf) to the oxide material.

According to example embodiments, a switching device of an active display device includes a double-gate thin film transistor (TFT) having two gates; and at least two gate lines respectively connected to the two gates of the double-gate TFT.

According to example embodiments, the at least two gate lines correspond to each of pixel rows of the active display device.

According to example embodiments, the at least two gate lines correspond to each of pixel rows of the active display device, and the two gates of the double-gate TFT are connected to the at least two gates lines from different pixel rows.

According to example embodiments, a positive gate voltage is applied to the two gates during a pixel charging time, and during times other than the pixel charging time, a negative gate voltage is applied to one of the two gates while a positive gate voltage is applied to the other one of the two gates.

According to example embodiments, a method of driving a switching device of an active display device includes applying a positive gate voltage during a pixel charging time to the at least two gate lines respectively connected to at least two thin film transistors (TFTs) connected in series such that the at least two TFTs are turned on; and, during times other than the pixel charging time, turning off at least one of the at least two TFTs, and turning on remaining ones of the at least two TFTs.

According to example embodiments, the method further includes applying a negative gate voltage to at least one of the at least two gate lines during the times other than the pixel charging time.

According to example embodiments, the method further includes applying the positive gate voltage at least once to each of the at least two gate lines during the times other than the pixel charging time.

According to example embodiments, a duty ratio of the positive gate voltage applied to each of the at least two TFTs is within about 0.1% to about 10%.

According to example embodiments, a method of driving a switching device of an active display device includes applying a positive gate voltage to two gates of a double-gate thin film transistor (TFT) during a pixel charging time; and during times other than the pixel charging time, applying a negative gate voltage to one of the two gates of the double-gate TFT while applying the positive gate voltage to the other one of the two gates.

According to example embodiments, the method further includes applying the positive gate voltage at least once to each of the two gates during the times other than the pixel charging time.

According to example embodiments, the method further includes applying the positive voltage having a duty ratio from about 0.1% to about 10% to each of the two gates of the double-gate TFT.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
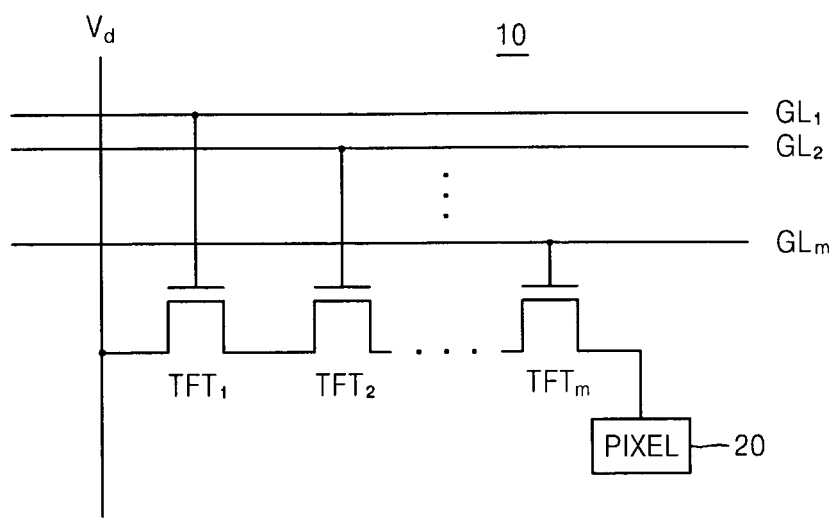
FIG. 1 illustrates a structure of a switching device of an active display device according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 illustrates a structure of a switching device 10 of an active display device according to example embodiments. Referring to FIG. 1, the switching device 10 that may control an operation of a pixel 20 may include a plurality of thin film transistors (TFTs) $TFT_1$, $TFT_2$, ..., $TFT_m$ that are connected in series, and a plurality of gate lines $GL_1$, $GL_2$, ..., $GL_m$ that are independently connected to the plurality of TFTs $TFT_1$, $TFT_2$, ..., $TFT_m$, respectively. Each of the plurality of TFTs, $TFT_1$, $TFT_2$, ..., $TFT_m$, may be, for example, an oxide semiconductor transistor using an oxide semiconductor as a channel material. For example, the oxide semiconductor may include an oxide selected from the group consisting of Zn-oxide, Ga—In—Zn oxide, In—Zn-oxide, In—Sn-oxide, and Sn-oxide, or may include a material obtained by doping an element selected from the group consisting of aluminum (Al), nickel (Ni), copper (Cu), tantalum (Ta), titanium (Ti), and hafnium (Hf) to the oxide.

As illustrated in FIG. 1, the pixel 20 is connected to the last TFT $TFT_m$ from among the plurality of TFTs $TFT_1$, $TFT_2$, ..., $TFT_m$. Also, a voltage line Vd is connected to the first $TFT_1$ from among the plurality of TFTs $TFT_1$, $TFT_2$, ..., $TFT_m$. The plurality of gate lines $GL_1$, $GL_2$, ..., $GL_m$ are connected to corresponding gates of the plurality of TFTs $TFT_1$, $TFT_2$, ..., $TFT_m$, respectively. For example, the first gate line $GL_1$ is connected to the gate of the first TFT $TFT_1$.

In this structure, a charging time during which a data voltage is applied to the pixel 20 may occur only when the plurality of TFTs $TFT_1$, $TFT_2$, ..., $TFT_m$ are all in ON states. When the pixel 20 is charged and any one of the plurality of TFTs $TFT_1$, $TFT_2$, ..., $TFT_m$ is turned off, a data voltage is not supplied to the pixel 20 and thus the pixel 20 maintains a charged state. Thus, it is not necessary that all of the plurality of TFTs $TFT_1$, $TFT_2$, ..., $TFT_m$ be turned off during a non-charging time period, and an ON voltage may be applied to only some, but not all, of the plurality of TFTs $TFT_1$, $TFT_2$, ..., $TFT_m$. By doing so, it is possible to prevent that the threshold voltage is shifted toward the negative voltage in each of the plurality of TFTs $TFT_1$, $TFT_2$, ..., $TFT_m$.

Figure 2:
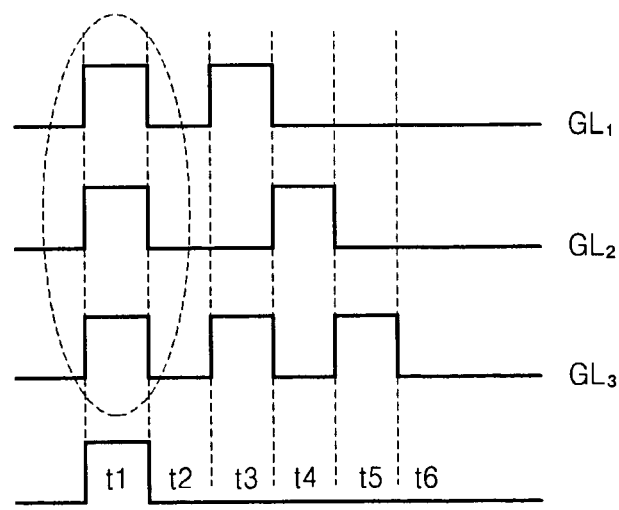
FIG. 2 is a timing diagram illustrating a method of driving the switching device of FIG. 1, according to example embodiments.

FIG. 2 is a timing diagram illustrating a method of driving the switching device 10 of FIG. 1, according to example embodiments. In FIG. 2, it is assumed that the switching device 10 has first through third TFTs that are connected in series. Thus, FIG. 2 illustrates waveforms of gate voltages that are input to three gate lines $GL_1$, $GL_2$, and $GL_3$, respectively. However, in designing the switching device 10, it is possible to use only two TFTs, or to use four or more TFTs. Referring back to FIG. 2, positive gate voltages are simultaneously applied to the three gate lines $GL_1$, $GL_2$, and $GL_3$ in a time $t_1$. Here, the three TFTs are all turned ON so that a data voltage is applied to the pixel 20. In other times $t_2$ and $t_3$, a negative gate voltage is applied to at least one of the three gate lines $GL_1$, $GL_2$, and $GL_3$, and, as a result, at least one of the three TFTs is turned OFF. In this regard, an effective gate charging time during which the pixel 20 connected to the switching device 10 is charged is shown in a lower part of FIG. 2. As shown, no data voltage is applied to the pixel 20 during times other than the time t1, which is a pixel charging time in which the three TFTs are all turned ON.

During the times other than the pixel charging time t1, the positive gate voltage is separately applied to each of the three gate lines $GL_1$, $GL_2$, and $GL_3$ so as to separately turn on the three TFTs. For example, referring to FIG. 2, the first TFT and the third TFT are turned on during the time $t_3$, the second TFT is turned on during a time $t_4$, and the third TFT is turned on during a time $t_5$. Although only the time $t_1$ through a time $t_6$ are illustrated in FIG. 2, the number of time periods may be greater than or less than the illustrated number of time periods. For example, times $t_1$ through $t_{1080}$ may be used when 1080 pixel rows of a full-HD class screen are scanned. In this case, for example, it is possible to turn ON each of the three TFTs one or more times while at least one TFT from among the three TFTs is turned OFF during any of times $t_2$ through $t_{1080}$. During a pixel charging time $t_1$ in which a data voltage is applied to the pixel 20 of one row from among the 1080 pixel rows, all three TFTs are turned on. By doing so, a threshold voltage that may have shifted in a negative voltage direction due to application of a negative gate voltage may return to its original state (hereinafter, returning a threshold voltage that has been shifted toward the negative voltage to its original state is referred to as refreshing the TFT).

Figure 3:
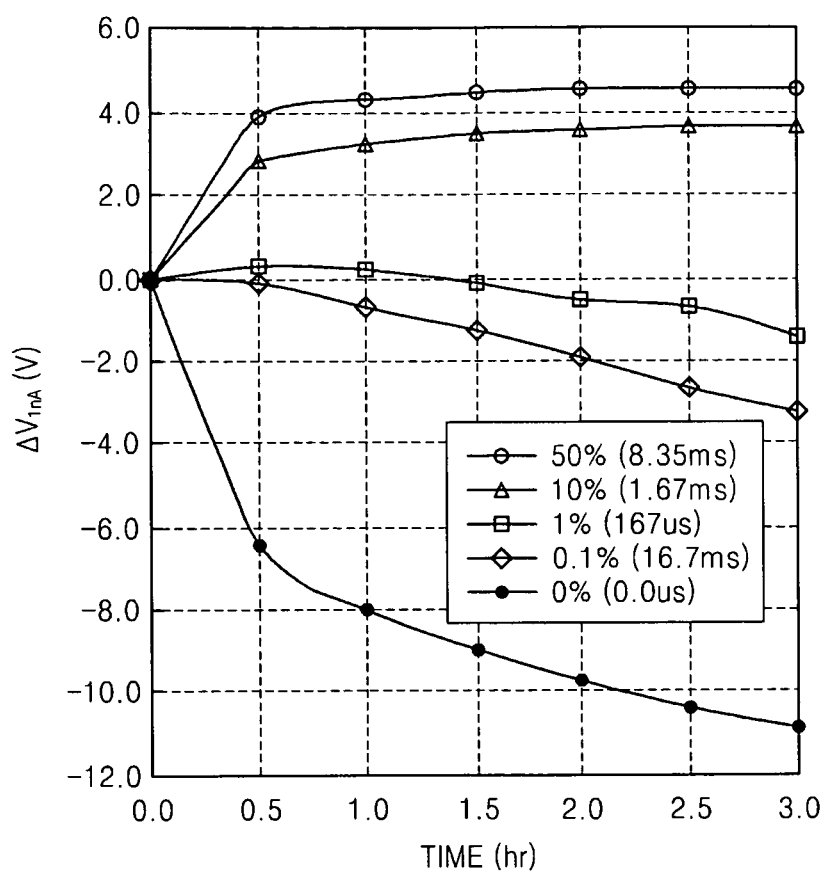
FIG. 3 is a graph obtained by measuring threshold voltage change ratios for different duty ratios of a positive voltage.

FIG. 3 is a graph obtained by measuring threshold voltage change ratios with respect to time for different duty ratios of a positive voltage pulse having a period corresponding to a frequency of 60 Hz. Here, the duty ratio indicates a ratio of a time during which a positive pulse voltage is applied to an entire time, wherein the entire time indicates one period pulse. Referring to the graph of FIG. 3, as the duty ratio is increased, a shift of a threshold voltage in a direction from a positive voltage toward a negative voltage is reduced. Also, with respect to duty ratios equal to or greater than about 10%, the threshold voltage is shifted from a negative voltage toward a positive voltage. Thus, while one screen is scanned in the active display device, it is possible to minimize the shift of the threshold voltage by adjusting the duty ratio of the pulse applied to each TFT. Only when a data voltage is applied to the pixel 20 are all TFTs of the switching device 10 connected to the pixel 20 turned on, and in other times, each of the TFTs may be separately turned on or off so as to control a shift of a threshold voltage. For example, the duty ratio of a positive gate voltage pulse applied to gates of the TFTs may be within about 0.1% to about 10%.

The switching device 10 operates in the following manner. In general, when light and a gate-OFF voltage (about −8V) are simultaneously applied to a TFT, holes that are generated in a channel layer of the TFT due to the light move to an interface between a gate insulating layer and a semiconductor channel layer, and then are trapped. The trapped holes shift a threshold voltage of the TFT in a direction from a positive voltage toward a negative voltage. Conversely, when a gate-ON voltage is applied to a gate of the TFT, the holes are freed from the interface between the channel layer and the gate insulating layer, and recombined with electrons, and instead, electrons are trapped in the interface. In this case, the threshold voltage is shifted in a direction from a negative voltage toward a positive voltage. In the case where only one TFT is used as a switching device, a positive gate voltage is applied to a gate of the TFT for a relatively short amount of time, and a negative gate voltage is applied to the gate of the TFT for a relatively long amount of time. As a result, a threshold voltage of the TFT may shift in a direction from a positive voltage toward a negative voltage. In the case of the switching device 10 of FIG. 1, at least two TFTs are used so that it is possible to increase a time during which a positive gate voltage is applied to each gate of the two TFTs. By doing so, it is possible to prevent threshold voltages of the two TFTs from being shifted in a direction from a positive voltage toward a negative voltage, so that electrical reliability of the switching device 10 may be improved, and lifetime of the active display device may increase.

Figure 4:
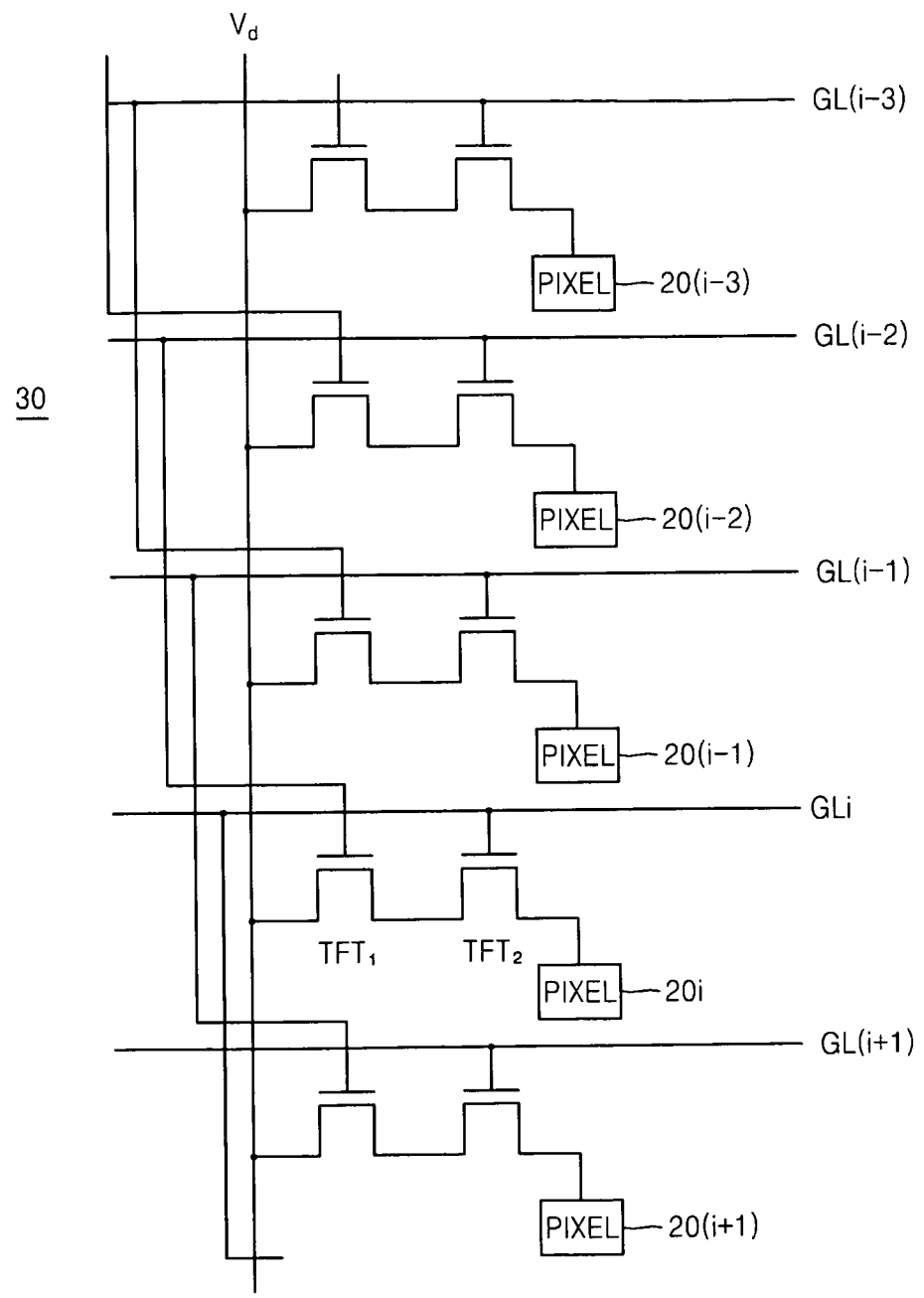
FIG. 4 illustrates a structure of a switching device according to example embodiments.

FIG. 4 is a diagram for illustrating a structure of a switching device 30 according to example embodiments. The switching device 30 of FIG. 4 is similar to the switching device 10 of FIG. 1 in that the switching device 30 has a plurality of TFTs $TFT_1$ and $TFT_2$ that are connected in series, and different gate lines are connected to the plurality of TFTs $TFT_1$ and $TFT_2$, respectively. However, unlike the switching device 10 of FIG. 1, the switching device 30 of FIG. 4 does not have separate gate lines for each transistor but allows transistors from different pixel rows to share a gate line.

In the case where the switching device 10 is configured in a manner illustrated in FIG. 1, one active display device uses a number of unique gate lines equal to the number of TFTs in the switching device 10 in each of pixel rows. Thus, if the switching device 10 for one pixel 20 has m TFTs, separate 1080×m gate lines are necessary for a full-HD screen having 1080 pixel rows. On the other hand, in the case where the switching device 30 is configured in a manner illustrated in FIG. 4, it is not necessary to add unique gate lines by using existing gate lines.

Referring to FIG. 4, the switching device 30 has two TFTs $TFT_1$ and $TFT_2$. For example, in an $i^{th}$ pixel row, a pixel $20_i$ is connected to the second $TFT_2$ of the two TFTs $TFT_1$ and $TFT_2$ connected in series. A voltage line Vd is connected to the first TFT $TFT_1$. Here, a gate of the second $TFT_2$ is connected to a gate line $GL_i$ of the $i^{th}$ pixel row whereas a gate of the first TFT $TFT_1$ is connected to a gate line of another pixel row. For example, as illustrated in FIG. 4, the gate of the first TFT $TFT_1$ may be connected to a gate line $GL_{(i-2)}$ of an $(i-2)^{th}$ pixel row. In an example embodiment, the gate of the second $TFT_2$ may be connected to the gate line $GL_{(i-2)}$ of the $(i-2)^{th}$ pixel row, and the gate of the first TFT $TFT_1$ may be connected to the gate line $GL_i$ of the $i^{th}$ pixel row. Also, in designing the switching device 30, the gate of the first TFT $TFT_1$ may be connected to another gate line such as a gate line $GL_{(i-1)}$ of an $(i-1)^{th}$ pixel row or a gate line $GL_{(i-3)}$ of an $(i-3)^{th}$ pixel row.

Figure 5:
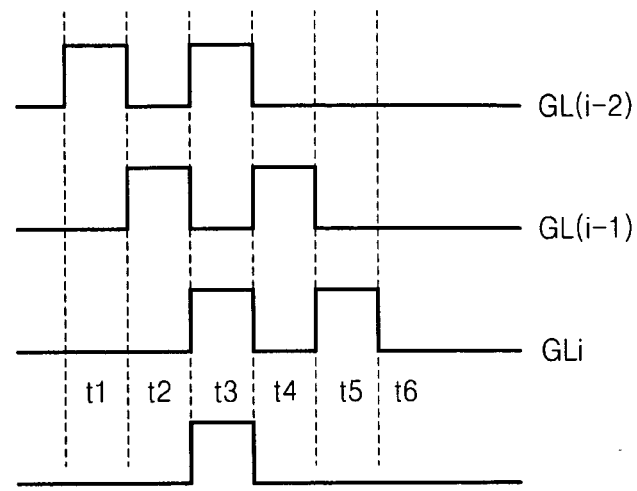
FIG. 5 is a timing diagram illustrating a method of driving the switching device of FIG. 4, according to example embodiments.

FIG. 5 is a timing diagram illustrating a method of driving the switching device 30 of FIG. 4, according to example embodiments. Referring to FIG. 5, a positive pulse is applied to the gate line $GL_{(i-2)}$ in a time $t_1$ and a time $t_3$, a positive pulse is applied to the gate line $GL_{(i-1)}$ in a time $t_2$ and a time $t_4$, and positive pulse is applied to the gate line $GL_i$ in the time $t_3$ and a time $t_5$. Thus, first and second TFTs $TFT_1$ and $TFT_2$ are all turned on in the time $t_3$, and at this time, a data voltage is applied to the $i^{th}$ pixel $20_i$. A positive gate voltage is applied to the first TFT $TFT_1$ in the time $t_1$ so that the first TFT $TFT_1$ is refreshed. Also, the second $TFT_2$ may be refreshed in the time $t_5$. In FIG. 5, the positive gate voltage is applied only once to each of the first TFT $TFT_1$ and the second $TFT_2$ during times other than the time $t_3$. However, provided that the first TFT $TFT_1$ and the second $TFT_2$ are not simultaneously turned on during other times except for the time $t_3$, which is a pixel charging time, the positive gate voltage may be applied at least twice to each of the first TFT $TFT_1$ and the second $TFT_2$.

Figure 6:
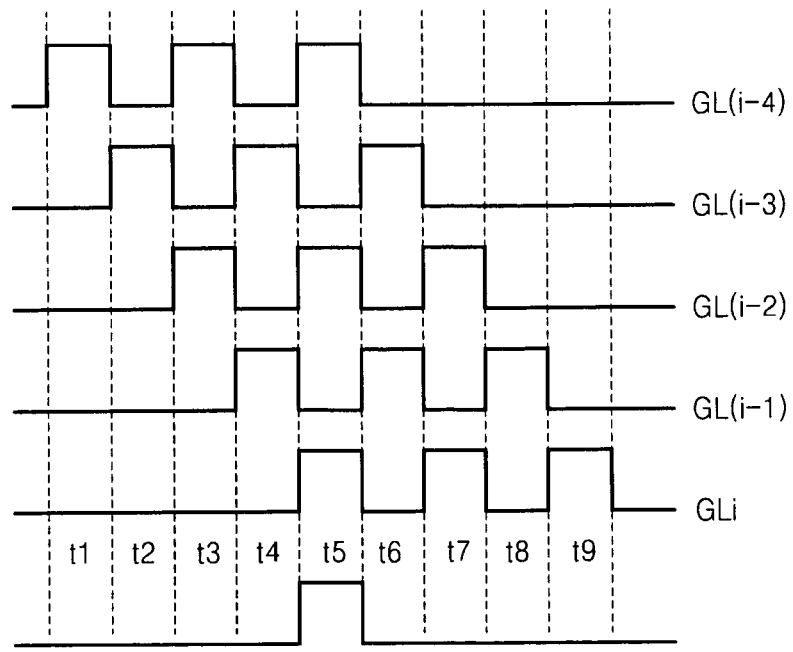
FIG. 6 is a timing diagram illustrating another example method of driving the switching device of FIG. 4.

In FIG. 4, the switching device 30 has the two TFTs $TFT_1$ and $TFT_2$. However, in other example embodiments, the switching device 30 may have three or more TFTs. If the switching device 30 has three TFTs, the third TFT may be connected to a gate line $GL_{(i-4)}$ of an $(i-4)^{th}$ pixel row, or to a gate line $GL_{(i+2)}$ of an $(i+2)^{th}$ pixel row. In the case where the third TFT may be connected to the gate line $GL_{(i-4)}$ of the $(i-4)^{th}$ pixel row, a gate voltage pulse is applied to each pixel row as illustrated in FIG. 6. In the case of FIG. 6, the $i^{th}$ pixel $20_i$ is applied a data voltage in a time $t_5$.

Meanwhile, the switching device 10 of FIG. 1 and the switching device 30 of FIG. 4 use a plurality of TFTs. However, the switching device 10 of FIG. 1 and the switching device 30 of FIG. 4 may use a double-gate TFT having two gates. The double-gate TFT has a structure in which a first insulating layer and a first gate are arranged below a channel formed of a semiconductor, and a second insulating layer and a second gate are arranged above the oxide semiconductor. For ease of description, the first gate below the oxide semiconductor is referred to as a bottom gate, and the second gate above the oxide semiconductor is referred to as a top gate.

Figure 7:
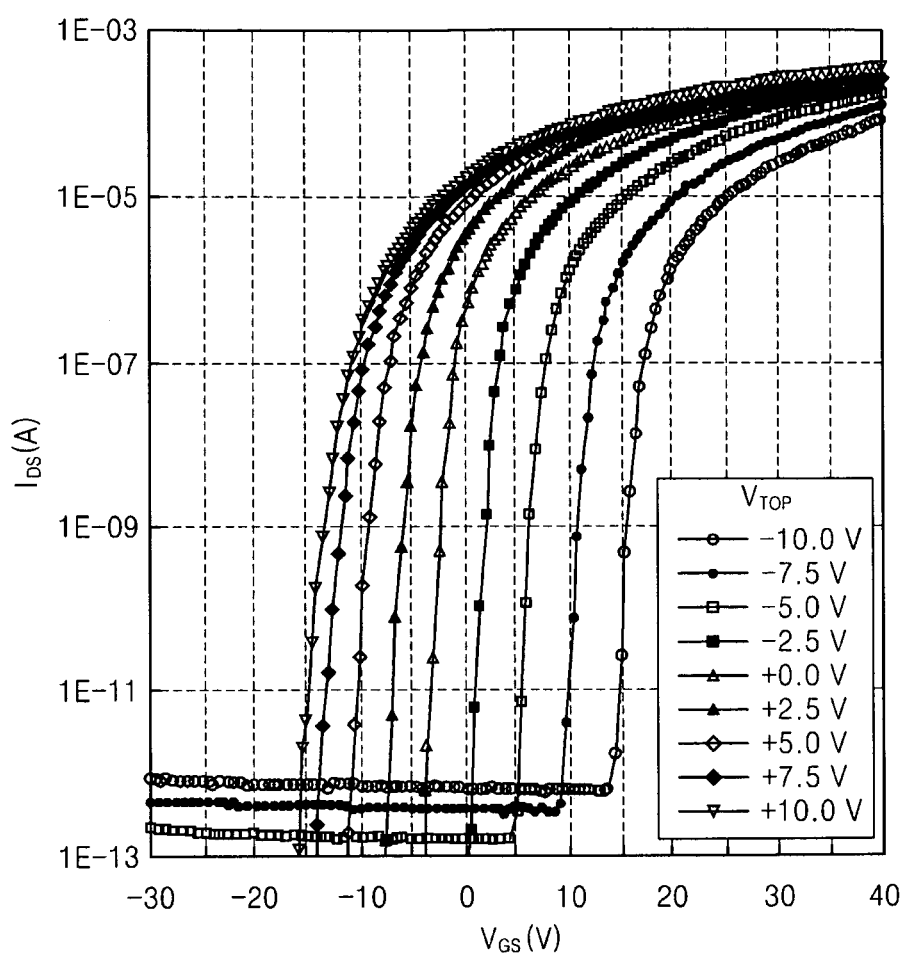
FIG. 7 illustrates a voltage transfer characteristic with respect to magnitude of a voltage applied to a top gate in a double-gate structure.

With respect to the TFT having a double-gate structure, a transfer curve shown in FIG. 7 may be obtained by applying a fixed direct-current (DC) to an electrode of the top gate, and by applying a range of voltages from about −30V to about +40V to an electrode of the bottom gate. Referring to FIG. 7, as a DC voltage increases from a negative voltage to a positive voltage at the electrode of the top gate, a threshold voltage of the TFT in the bottom gate increases from a negative voltage toward a positive voltage. For example, in order to turn on the TFT while a voltage of about −10V is applied to the top gate, a voltage of about +15V or a larger voltage is applied to the bottom gate.

Figure 8:
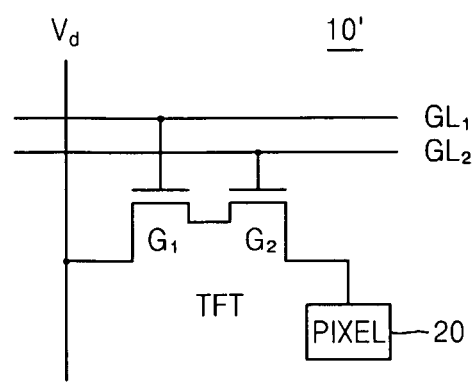
FIG. 8 illustrates a structure of a switching device having a double-gate thin film transistor (TFT), according to example embodiments.

It is possible to configure a switching device by using a characteristic of the double-gate TFT. For example, FIG. 8 is a diagram of a switching device 10' having a structure in which separate first and second gate lines $GL_1$ and $GL_2$ are respectively connected to first and second gates $G_1$ and $G_2$ of a double-gate TFT. For example, the first gate $G_1$ is connected to the first gate line $GL_1$, and the second gate $G_2$ is connected to the second gate line $GL_2$. Thus, the switching device 10' of FIG. 8 is obtained by replacing the plurality of TFTs in the structure of the switching device 10 of FIG. 1 with the double-gate TFT. According to the structure of the switching device 10', when a positive gate electrode is applied to the two gates $G_1$ and $G_2$ during a pixel charging time, the double-gate TFT is turned on. During other times except for the pixel charging time, a negative voltage is applied to one of the gate lines $GL_1$ and $GL_2$, wherein the negative voltage is sufficient to turn off the double-gate TFT. Referring to the graph of FIG. 7, an OFF voltage of the TFT may be about −10V, and an ON voltage may be a voltage of about +15V. During other times, except for the pixel charging time during which the gates $G_1$ and $G_2$ of the double-gate TFT are simultaneously turned on, the double-gate TFT may be refreshed in a manner described with reference to FIGS. 1 and 2.

Figure 9:
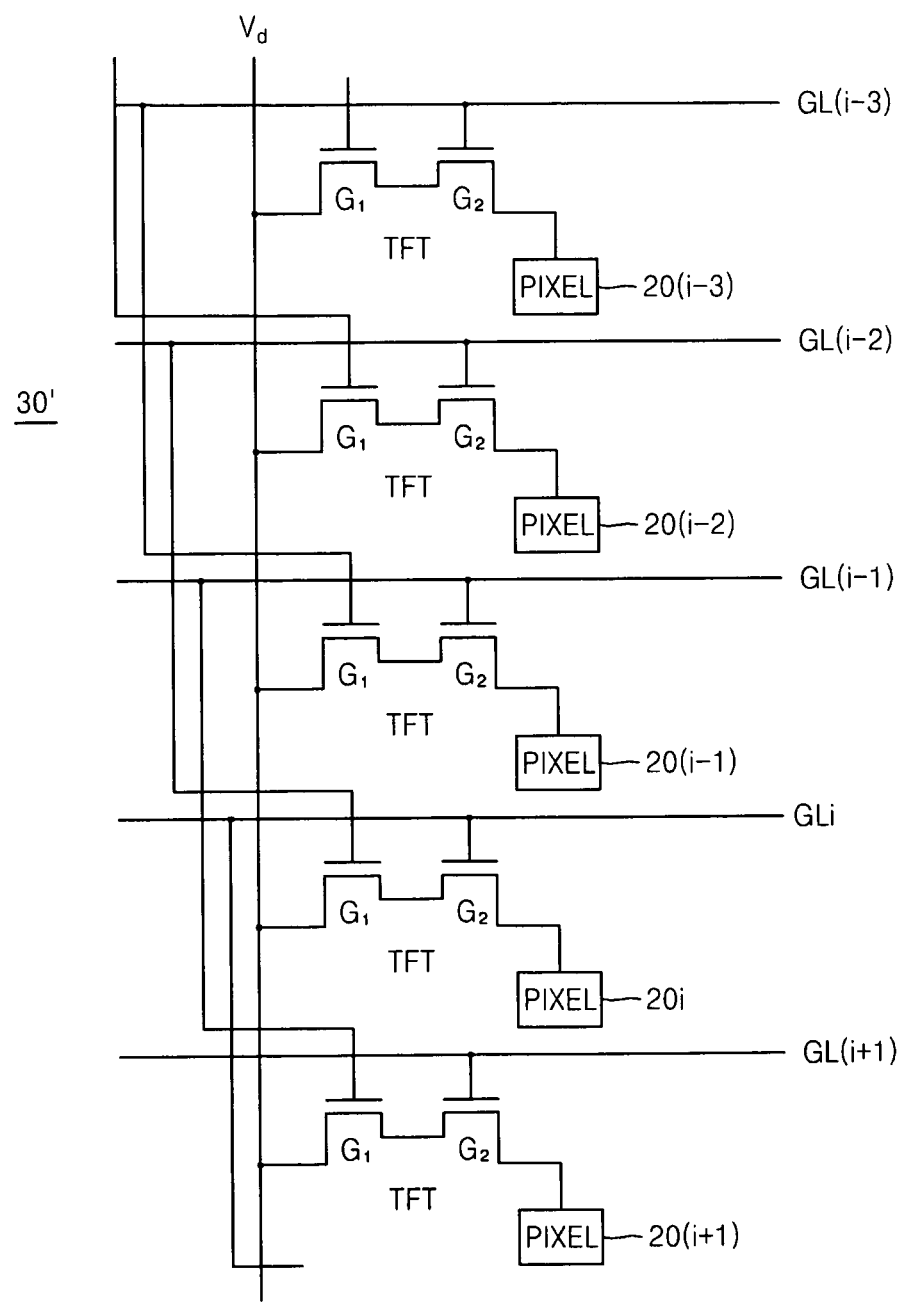
FIG. 9 illustrates another switching device having a double-gate TFT, according to example embodiments.

In addition, FIG. 9 is a diagram of a switching device 30' having a double-gate TFT structure. The switching device 30' of FIG. 9 is obtained by replacing the plurality of TFTs in the structure of the switching device 30 of FIG. 4 with double-gate TFTs. Thus, the switching device 30' of FIG. 9 does not have unique gate lines for each transistor but uses gate lines of adjacent pixel rows. For example, in a TFT at an $i^{th}$ pixel row, a first gate $G_1$ may be connected to a gate line $GL_{(i-2)}$ of an $(i-2)^{th}$ pixel row and a second gate $G_2$ may be connected to a gate line $GL_i$ of the $i^{th}$ pixel row. Although, FIG. 9 illustrates that the first gate $G_1$ is connected to the gate line $GL_{(i-2)}$ of the $(i-2)^{th}$ pixel row, the first gate $G_1$ may be connected to any gate line of any pixel row, except for the gate line $G_i$, of the $i_{th}$ pixel row. An operation of the switching device 30' is somewhat similar to the operation of the switching device 30 of FIG. 4.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:
1. A switching device comprising:
at least two thin film transistors (TFTs) connected in series; and
at least two gate lines respectively connected to the at least two TFTs, wherein a number of the at least two gate lines in each pixel row of an active display device is equal to a number of the at least two TFTs, the at least two gate lines being connected to TFTs in only one pixel row, wherein,
the switching device is configured to, during a pixel charging time, apply a positive gate voltage to at least two gate lines such that the at least two TFTs are turned on, the pixel charging time being a time when a data voltage is applied to a pixel associated with the at least two TFTs, and the switching device is configured to, during times other than the pixel charging time, turn off at least one of the at least two TFTs and turn on remaining ones of the at least two TFTs.

2. The switching device of claim 1, wherein each of the at least two TFTs includes an oxide semiconductor transistor having an oxide semiconductor as a channel.

3. The switching device of claim 2, wherein the oxide semiconductor includes an oxide material selected from a group consisting of Zn-oxide, Ga—In—Zn oxide, In—Zn-oxide, In—Sn-oxide, and Sn-oxide, or includes an oxide material obtained by doping an element selected from a group consisting of aluminum (Al), nickel (Ni), copper (Cu), tantalum (Ta), titanium (Ti), and hafnium (Hf) to the oxide material.

4. The switching device of claim 2, wherein the at least two gate lines are respectively connected to gates of the at least two TFTs.

5. A switching device of an active display device, the switching device comprising:
   a double-gate thin film transistor (TFT) having two gates; and
   at least two gate lines respectively connected to the two gates of the double-gate TFT, wherein the at least two gate lines are in a same pixel row of the active display device as the double gate TFT and the at least two gate lines are connected to the double-gate TFT in only one pixel row.

6. The switching device. of claim 5, wherein a positive gate voltage is applied to the two gates during a pixel charging time, and
   during times other than the pixel charging time, a negative gate voltage is applied to one of the two gates while a positive gate voltage is applied to the other one of the two gates.

7. A method of driving a switching device of an active display device, the method comprising:
   applying a positive gate voltage during a pixel charging time to at least two gate lines respectively connected to at least two thin film transistors (TFTs) connected in series such that the at least two TFTs are turned on; and
   during times other than the pixel charging time, turning off at least one of the at least two TFTs, and turning on remaining ones of the at least two TFTs, the pixel charging time being a time when a data voltage is applied to a pixel associated with the at least two TFTs.

8. A method of driving a switching device of an active display device, comprising:
   applying a positive gate voltage during a pixel charging time to at least two gate lines respectively connected to at least two thin film transistors (TFTs) connected in series such that the at least two TFTs are turned on;
   during times other than the pixel charging time, turning off at least one of the at least two TFTs, and turning on remaining ones of the at least two TFTs; and
   applying a negative gate voltage to at least one of the at least two gate lines during the times other than the pixel charging time.

9. The method of claim 8, further comprising:
   applying the positive gate voltage at least once to each of the at least two gate lines during the times other than the pixel charging time.

10. The method of claim 9, wherein a duty ratio of the positive gate voltage applied to each of the at least two TFTs is within about 0.1% to about 10%.

11. A method of driving a switching device of an active display device, the method comprising:
    applying a positive gate voltage to two gates of a double-gate thin film transistor (TFT) during a pixel charging time; and
    during times other than the pixel charging time, applying a negative gate voltage to one of the two gates of the double-gate TFT while applying the positive gate voltage to the other one of the two gates.

12. The method of claim 11, further comprising:
    applying the positive gate voltage at least once to each of the two gates during the times other than the pixel charging time.

13. The method of claim 12, further comprising:
    applying the positive voltage having a duty ratio from about 0.1% to about 10% to each of the two gates of the double-gate TFT.

14. The switching device of claim 1, wherein the pixel is directly connected to only one of the at least two TFTs.

* * * * *